(12) United States Patent
Jacques et al.

(10) Patent No.: US 8,865,377 B2
(45) Date of Patent: Oct. 21, 2014

(54) METHOD AND SYSTEM FOR FORMING A DIAGONAL PATTERN USING CHARGED PARTICLE BEAM LITHOGRAPHY

(71) Applicant: D2S, Inc., San Jose, CA (US)

(72) Inventors: Etienne Jacques, Sunnyvale, CA (US); Jin Choi, Gyeonggi-do (KR); Kazuyuki Hagiwara, Tokyo (JP)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/802,257

(22) Filed: Mar. 13, 2013

(65) Prior Publication Data

US 2014/0272675 A1    Sep. 18, 2014

(51) Int. Cl.
*G03F 1/20* (2012.01)
*G03F 1/36* (2012.01)
*G03F 7/20* (2006.01)
*G06F 17/50* (2006.01)

(52) U.S. Cl.
CPC .............. *G03F 1/20* (2013.01); *G06F 17/5068* (2013.01); *G03F 7/2037* (2013.01); *G03F 1/36* (2013.01); *Y10S 430/143* (2013.01)
USPC .................. 430/5; 430/30; 430/296; 430/394; 430/396; 430/942; 716/53; 716/55

(58) Field of Classification Search
CPC ........... G03F 1/20; G03F 1/36; G03F 7/2037; G06F 17/5068
USPC .......... 430/5, 30, 296, 394, 396, 942; 716/53, 716/55
See application file for complete search history.

(56) References Cited

U.S. PATENT DOCUMENTS

| | | | |
|---|---|---|---|
| 7,799,489 B2 | 9/2010 | Fujimura et al. |
| 7,901,850 B2 | 3/2011 | Fujimura et al. |
| 8,137,871 B2 | 3/2012 | Zable et al. |
| 8,329,365 B2 | 12/2012 | Fujimura et al. |
| 8,475,980 B2 | 7/2013 | Choi et al. |
| 2011/0278731 A1 | 11/2011 | Fujimura et al. |
| 2012/0025108 A1 | 2/2012 | Fujimura et al. |
| 2012/0058432 A1 | 3/2012 | Choi et al. |
| 2012/0221980 A1 | 8/2012 | Fujimura et al. |

OTHER PUBLICATIONS

Office Action dated Jun. 17, 2014 for U.S. Appl. No. 13/802,298.

*Primary Examiner* — Christopher Young
(74) *Attorney, Agent, or Firm* — The Mueller Law Office, P.C.

(57) ABSTRACT

A method and system for fracturing or mask data preparation is disclosed in which the central core portion of a diagonal pattern is fractured using overlapping variable shaped beam (VSB) shots, and an outer portion of the diagonal pattern is fractured using non-overlapping VSB shots. A transition region is interposed between the central core and outer pattern portions, and transition region shots are generated so as to produce in the transferred pattern a smooth transition in pattern characteristics such as line edge roughness or period of waviness, from the central core portion of the pattern to the outer portion of the pattern. Methods for forming a semiconductor device layout pattern on a reticle or substrate are also disclosed.

26 Claims, 13 Drawing Sheets

METHOD AND SYSTEM FOR FORMING A DIAGONAL PATTERN USING CHARGED PARTICLE BEAM LITHOGRAPHY

RELATED APPLICATIONS

This application is related to U.S. patent application Ser. No. 13/802,298, filed Mar. 13, 2013, entitled "Method and System for Forming a Diagonal Pattern Using Charged Particle Beam Lithography", hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays or even other reticles. While conventional optical lithography uses a light source having a wavelength of 193 nm, extreme ultraviolet (EUV) or X-ray lithography are also considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical or non-optical lithography while others may be written using maskless direct write to fabricate the same substrate. Also, some patterns of a given layer may be written using optical or non-optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs are less than those for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks. For example, at the 20 nm logic process node, 40 nm to 60 nm SRAFs are needed on the mask for the highest precision layers.

EUV optical lithography has a much higher resolution than conventional optical lithography. The very high resolution of EUV obviates the need for OPC processing, resulting in less mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Current optical lithography writing machines typically reduce the photomask pattern by a factor of four during the optical lithographic process. Therefore, patterns formed on a reticle or mask must be four times larger than the size of the desired pattern on the substrate or wafer.

Current dynamic random access memory (DRAM) physical architectures use a series of parallel long diagonal patterns which fit into a rectangular boundary area. These patterns may form diffusion layers. The width of these patterns and the width of the spaces between adjacent patterns, called the line-space pitch, contribute to determining the area density of the DRAM, which is a critical factor in the DRAM business. Precisely forming these long diagonal patterns on a reticle using conventional non-overlapping VSB shots is very slow, requiring a very large number of shots.

SUMMARY OF THE DISCLOSURE

A method and system for fracturing or mask data preparation is disclosed in which a middle or central core portion of a diagonal pattern is fractured using overlapping variable shaped beam (VSB) shots, and an outer portion of the diagonal pattern is fractured using non-overlapping VSB shots. A transition region is interposed between the central core portion of the pattern and the outer portion of the pattern. Transition region shots are generated so as to produce in the transferred pattern a smooth transition in pattern characteristics such as line edge roughness or period of waviness, from the central core portion of the pattern to the outer portion of the pattern.

More generally, a method is disclosed for transitioning an outer portion of a diagonal pattern, fractured using non-overlapping VSB shots, to a central core portion of the diagonal pattern which may be fractured using any type of charged particle beam shot, including character projection (CP) shots such as circular CP shots.

Methods for forming a pattern on a reticle and for forming a pattern on a wafer are also disclosed.

DETAILED DESCRIPTION OF THE EMBODIMENTS

The improvements and advantages of the present disclosure can be accomplished by forming center portions of continuous track-type patterns using overlapping rectangular variable shaped beam (VSB) shots, by forming near-end portions of the track-type patterns using non-overlapping rectangular VSB shots, and by generating shots for one or more transition regions between the center and near-end portions of the patterns, such that the transition region shots form smooth pattern transitions on the surface of a substrate or wafer between the center and the near-end portions of the patterns.

Figure 1:
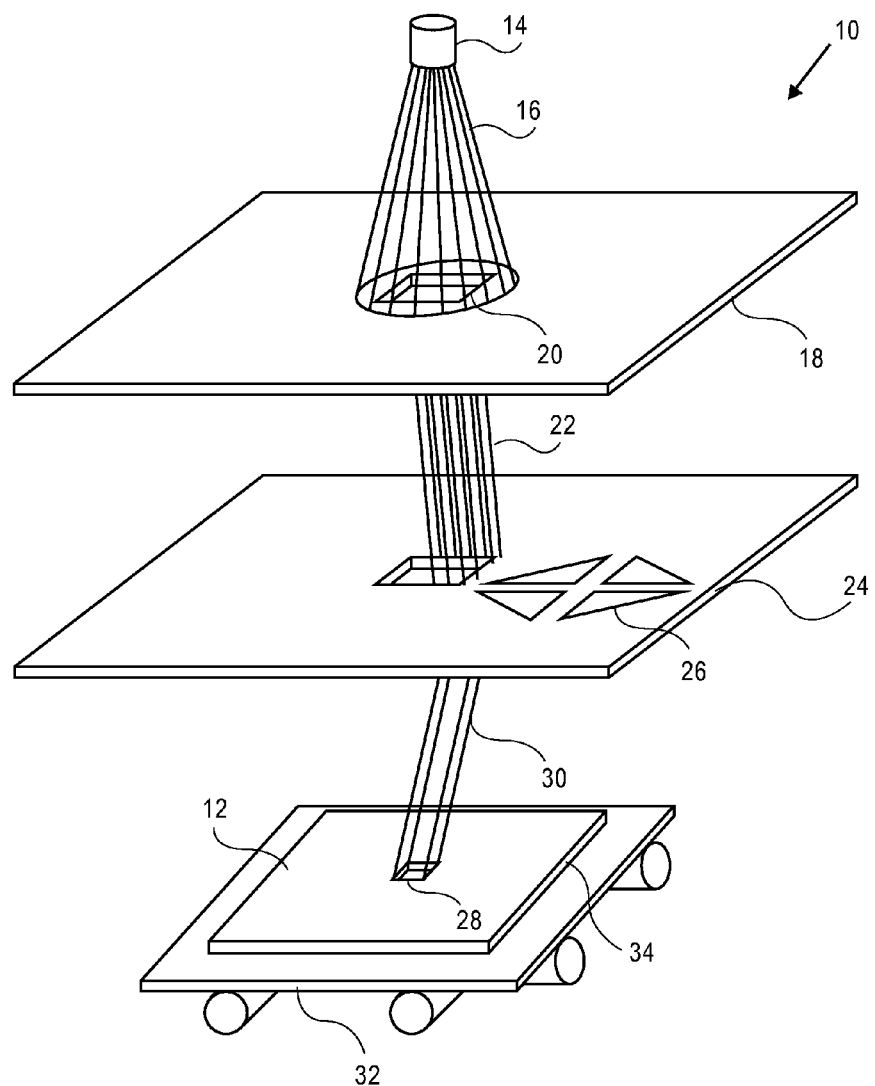
FIG. 1 illustrates an example of a character projection charged particle beam system.

Referring now to the drawings, wherein like numbers refer to like items, FIG. 1 identifies an embodiment of a lithography system, such as a charged particle beam writer system, in this case an electron beam writer system 10, that employs a variable shaped beam (VSB) to manufacture a surface 12 according to the present disclosure. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various simple shapes such as rectangles and triangles. Each aperture 26 formed in the stencil mask 24 may be used to form a pattern on the surface 12. An electron beam 30 emerges from one of the apertures 26 and is directed onto the surface 12 as a pattern 28. The surface 12 is coated with resist (not shown) which reacts with the electron beam 30. The electron beam 22 may be directed to overlap a variable portion of an aperture 26, affecting the size and shape of the pattern 28. The surface 12 is mounted on a movable platform 32. The platform 32 allows surface 12 to be repositioned so that patterns which are larger than the maximum deflection capability or field size of the charged particle beam 30 may be written to surface 12. In one embodiment the surface 12 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate. In another embodiment the surface 12 may be the surface of a substrate such as a silicon wafer.

The minimum size pattern that can be projected with reasonable accuracy onto a surface 12 is limited by a variety of short-range physical effects associated with the electron beam writer system 10 and with the surface 12. These effects include forward scattering, Coulomb effect, and resist diffusion. Beam blur, also called $β_f$, is a term used to include all of these short-range effects. The most modern electron beam writer systems can achieve an effective beam blur radius in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. The exposure time may be varied to compensate for various long-range effects such as back scatter and fogging in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current disclosure are targeted for use with charged particle beam writing systems which allow assignment of one of a relatively few dosage levels.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size.

Figure 2:
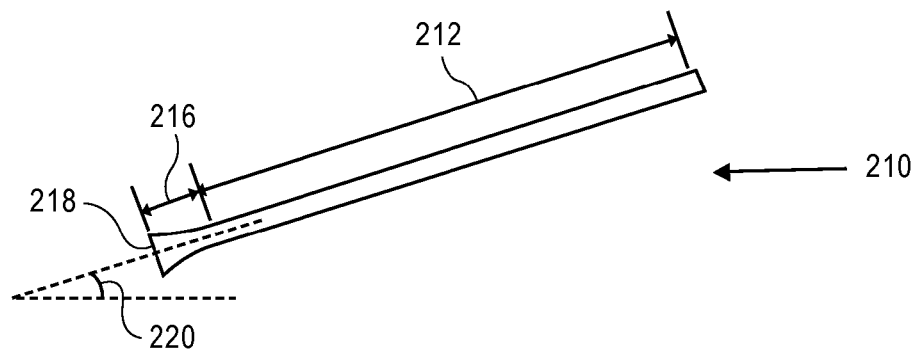
FIG. 2 illustrates an example of a diagonal pattern.

FIG. 2 illustrates an example of a diagonal pattern 210, such as may be found in some DRAM mask designs, particularly those of the so-called "6F2" design. The pattern 210 consists of a core region 212 and an outer region 216. The pattern is of constant width in the core region 212. The pattern forms an angle 220 with respect to the x-axis. In this example, the pattern flares in the outer region 216, the width of the pattern increasing closer to the pattern end 218. Many different schemes are possible to address the edge conditions that the OPC of the mask shapes needs to consider. But what is common is that there is a core region 212 in which the pattern 210 has a constant width. Patterns such as pattern 210 are normally critical dimension patterns; they are as small as can be reliably fabricated. The flaring of the pattern in the end region 216 and possible OPC serifs (not illustrated) in the end regions 216 are conventionally carefully designed and simulated so as to form a desired wafer pattern.

Figure 3:
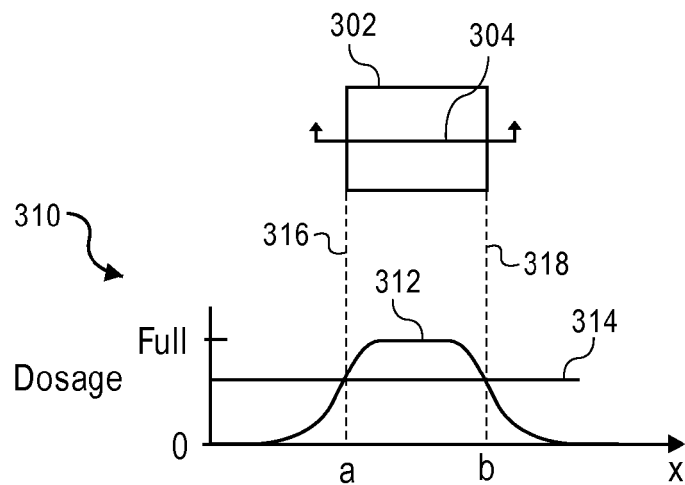
FIG. 3 illustrates a cross-sectional dosage graph of a rectangular VSB shot.

FIG. 3 illustrates an example of a pattern 302 which would be formed on a resist-coated surface by a rectangular VSB shot. Dosage graph 310 illustrates the dosage 312 registered along a line 304 through pattern 302, this dosage being called the cross-sectional dosage. As can be seen from dosage curve 312, a pre-determined "full" dosage is registered only in the middle part of pattern 302. For patterns where the distance between x-coordinate "a" and the x-coordinate "b" is sufficiently small, the "full" dosage may not be attained anywhere in the cross-sectional dosage. On the left and right sides of shot 302, dosage registered by the resist trails off in a Gaussian or nearly-Gaussian curve. The shape of the Gaussian or nearly-Gaussian curve depends on the various components of beam blur. Also shown in dosage graph 310 is the resist threshold 314. The resist will register as a pattern on the surface only those areas which receive dosages above the resist threshold 314. The dosage curve 312 intersects the threshold 314 at x-coordinates "a" and "b". The X-coordinate "a" is therefore the minimum x-coordinate that will be registered by the resist along line 304, as shown by connector 316. Similarly, the x-coordinate "b" is the maximum x-coordinate that will be registered by the resist along line 304, as shown by connector 318.

Figure 4A:
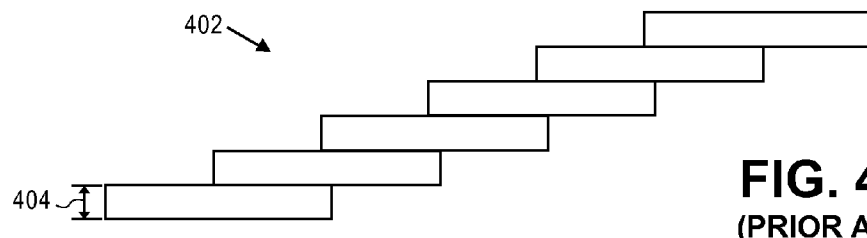
FIG. 4A illustrates an example of a set of non-overlapping VSB shots that can form a diagonal pattern on a surface.
Figure 4B:
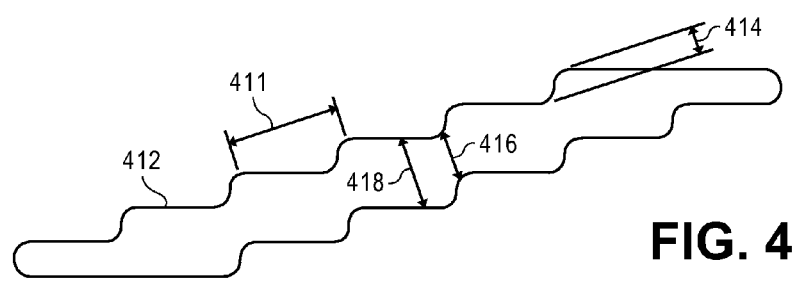
FIG. 4B illustrates an example of a pattern that may be formed on a reticle from the set of shots in FIG. 4A.
Figure 4C:
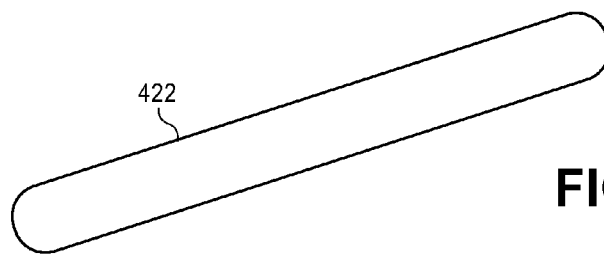
FIG. 4C illustrates an example of a pattern that may be formed on a substrate from using a 193i optical lithographic process using a photomask manufactured from the reticle with the pattern of FIG. 4B.
Figure 4D:
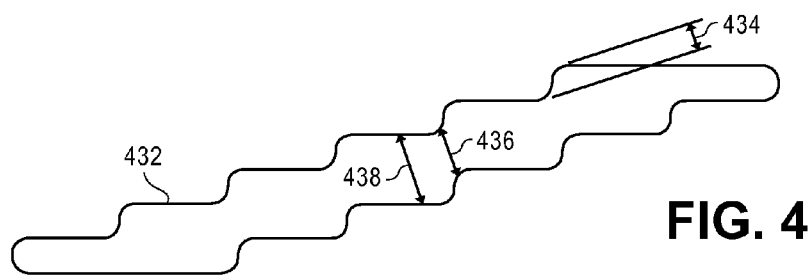
FIG. 4D illustrates an example of a pattern that may be formed on a substrate from using an EUV optical lithographic process using a photomask manufactured from the reticle with the pattern of FIG. 4B.

FIG. 4A illustrates a set of conventional non-overlapping VSB shots 402 which may be used to form a constant-width diagonal pattern such as the core region 212 of diagonal pattern 210 of FIG. 2. Each shot in set of shots 402 has a y-dimensional size of 404. FIG. 4B illustrates an example of a pattern 412 that may be formed on a surface from the set of shots 402. As can be seen, all corners of the pattern 412 are rounded, due to beam blur. Consequently, both diagonal edges of pattern 412 are wavy, with the waviness having a period 411 and an amplitude 414. The amplitude 414 of the waviness is directly proportionate to what is typically called the line edge roughness (LER). Pattern 412 also has a line width roughness (LWR), which indicates the difference between the widest point 418 in the pattern and the narrowest point 416 in the pattern 412. Both LER and LWR in this application are measured transverse to the overall angle of the diagonal pattern desired on the wafer, illustrated as angle 220 in FIG. 2. FIG. 4C illustrates an example of a pattern 422 that may be formed on a substrate such as a silicon wafer using 193 nm immersion or 193i optical lithography with a photomask manufactured from a reticle containing the pattern 412. For lines drawn at the limit of 193i lithography, presently somewhere between 100 nm and 200 nm in width in mask dimensions, the wavy patterns on the mask become straight lines on the substrate or wafer. The pattern 422 has an LER and an LWR of nearly zero. FIG. 4D illustrates an example of a pattern 432 that may be formed on a substrate such as a silicon wafer using EUV optical lithography using a photomask manufactured from a reticle containing the pattern 412. The pattern 432 has an LER indicated by element 434. The LWR of pattern 432 is indicated by the difference of the widest part of the pattern 438 and the narrowest part of the pattern 436. As can be seen by comparing pattern 422 and pattern 432 with pattern 412, the higher resolution of EUV optical lithography may more faithfully reproduce the pattern 412, compared with 193i optical lithography. The higher resolution EUV lithography also results in a substrate pattern 432 with a higher LER and LWR than illustrated in pattern 422.

Figure 5A:
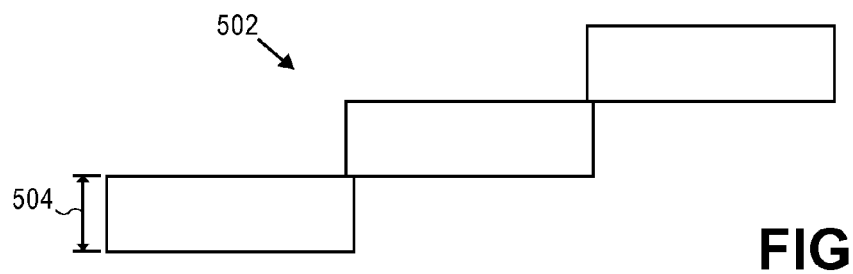
FIG. 5A illustrates another example of a set of non-overlapping VSB shots that can form a diagonal pattern on a surface.
Figure 5B:
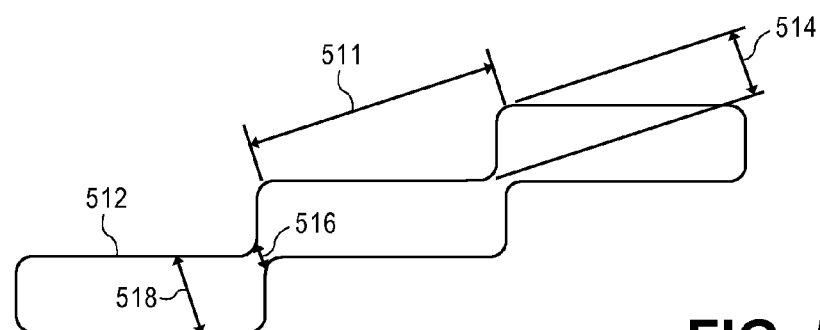
FIG. 5B illustrates an example of a pattern that may be formed on a reticle from the set of shots in FIG. 5A.
Figure 5C:
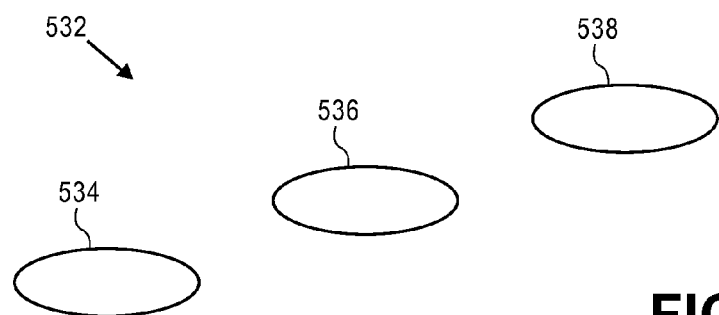
FIG. 5C illustrates an example of a pattern that may be formed on a substrate from using an optical lithographic process using a photomask manufactured from the reticle with the pattern of FIG. 5B.

FIG. 5A illustrates an example of an unsuccessful attempt to form a constant-width diagonal pattern such as the core region 212 of the diagonal pattern 210 of FIG. 2, using larger non-overlapping VSB shots. Each shot in set of shots 502 has a y-dimensional size of 504, which in this example is twice as large as the y-dimension 404 of shots in set of shots 402 in FIG. 4A. The larger shots in set of shots 502 allow formation of the diagonal pattern with one-half as many VSB shots, compared to the set of shots 402. FIG. 5B illustrates an example of a pattern 512 that may be formed on a surface from the set of shots 502. As with pattern 412, corners of the pattern 512 are rounded, due to beam blur. The waviness of pattern 512 has a period 511 which in this example is twice the waviness period 411 of pattern 412. The LER indicated by element 514 of pattern 512 is also larger than the LER indicated by element 414 of pattern 412. The LWR of pattern 512, which is indicated by the difference between the widest point 518 in pattern 512 and the narrowest point 516 in pattern 512, is much larger than the LWR of pattern 412. FIG. 5C illustrates an example of a pattern 532 that may be formed on a substrate such as a silicon wafer using 193 nm optical lithography with a photomask manufactured from a reticle containing the pattern 512. The pattern 532 comprises shape 534, shape 536 and shape 538. As can be seen, the narrow portion 516 of mask pattern 512 did not register on the resist-coated substrate. Mask patterns with high LWR such is illustrated by mask pattern 512 may produce unusable results when used in 193i lithography. Using conventional non-overlapping VSB shots, LWR may be controlled only by modifying shot size.

Figure 6A:
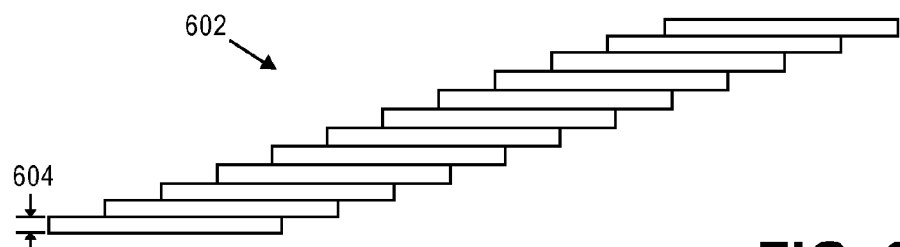
FIG. 6A illustrates another example of a set of non-overlapping VSB shots that can form a diagonal pattern on a surface.
Figure 6B:
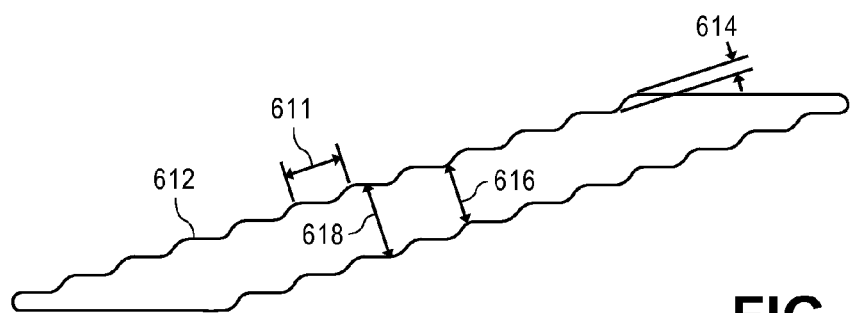
FIG. 6B illustrates an example of a pattern that may be formed on a reticle from the set of shots in FIG. 6A.
Figure 6C:
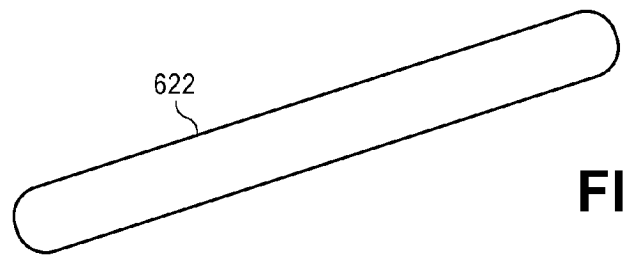
FIG. 6C illustrates an example of a pattern that may be formed on a substrate from using an optical lithographic process using a photomask manufactured from the reticle with the pattern of FIG. 6B.

FIG. 6A illustrates yet another example of a set of conventional non-overlapping VSB shots 602 which may be used to form a constant-width diagonal pattern such as the core region 212 of diagonal pattern 210 of FIG. 2. Each shot in set of shots 602 has a y-dimensional size of 604, which is one-half the y-dimension 404 of shots in set of shots 402. Because the shots in set of shots 602 are smaller than the shots in set of shots 402, more shots are required to form a given length diagonal pattern, compared to set of shots 402. FIG. 6B illustrates an example of a pattern 612 that may be formed on a surface from the set of shots 602. As with pattern 412, corners of the pattern 612 are rounded, due to beam blur. The waviness of pattern 612 has a period 611 which in this example is one-half the period 411 of pattern 412. The LER indicated by element 614 of pattern 612 is also smaller than the LER indicated by element 414 of pattern 412. The LWR of pattern 612, which is indicated by the difference between the widest point 618 in pattern 612 and the narrowest point 616 in pattern 612, is smaller than the LWR of pattern 412. FIG. 6C illustrates an example of a pattern 622 that may be formed on a substrate such as a silicon wafer using 193 nm optical lithography with a photomask manufactured from a reticle containing the pattern 612. In this set of examples, both shot set 402 and shot set 602 may produce the desired images on the substrate. Because shot set 402 has one-half as many shots of shot set 602, shot set 402 is more desirable for practical manufacturing of the masks. In these examples, shot set 502 is not acceptable because of poor imaging on the substrate.

Figure 7A:
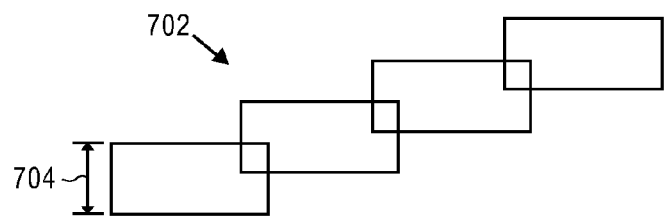
FIG. 7A illustrates an example of a set of overlapping VSB shots that can form a diagonal pattern on a surface.
Figure 7B:
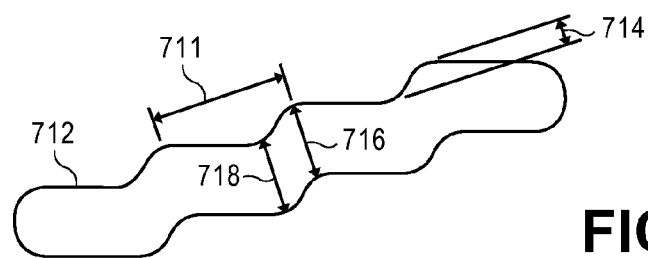
FIG. 7B illustrates an example of a pattern that may be formed on a reticle from the set of shots in FIG. 7A.
Figure 7C:
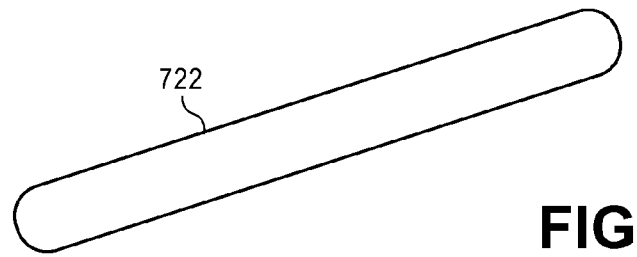
FIG. 7C illustrates an example of a pattern that may be formed on a substrate from using an optical lithographic process using a photomask manufactured from the reticle with the pattern of FIG. 7B.

FIG. 7A illustrates an example of a set of overlapping VSB shots which can form a constant-width diagonal pattern such as the core region 212 of diagonal pattern 210 of FIG. 2. Each shot in set of shots 702 has a y-dimensional size of 704, which is the same as y-dimensional size 504 of shots in set of shots 502. In this example the overlap of shots in set of shots 702 has been determined so as to nearly-minimize LWR. FIG. 7B illustrates a pattern 712 that may be formed on a surface such as a reticle with the set of shots 702. The period 711 of pattern 712 is between the period 511 of pattern 512 and the period 411 of pattern 412, indicating that the shot count required to form a diagonal pattern on the surface is better—i.e. lower—for set of shots 702 than for set of shots 402. The pattern 712 has an LER indicated by element 714. The LWR of pattern 712 is indicated by the difference of the width 716 and width 718. Because widths 716 and 718 are almost equal, the LWR is nearly-zero. FIG. 7C illustrates an example of a pattern 722 that may be formed on a substrate such as a silicon wafer using 193i optical lithography with a photomask manufactured from a reticle containing the pattern 712. FIGS. 7A-C illustrate how use of overlapping shots allows LWR to be optimized independently of LER. Depending on the requirements of an individual design, use of overlapping shots with LWR-optimization can allow formation of diagonal patterns with fewer shots than when non-overlapping VSB shots are used.

Figure 8A:
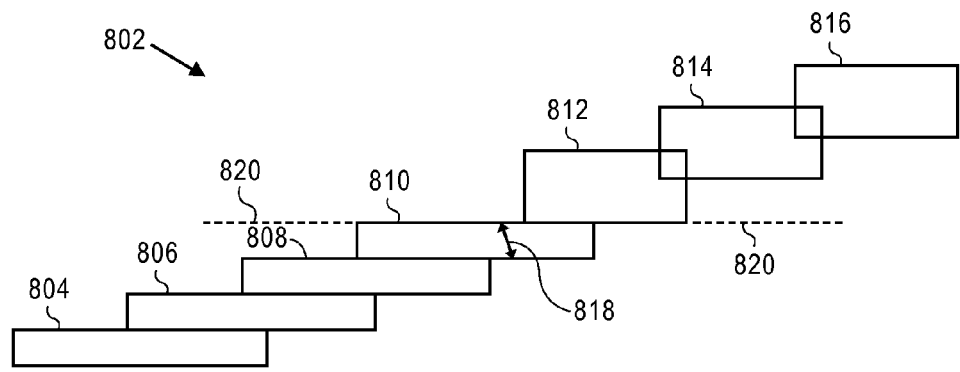
FIG. 8A illustrates an example of a notch created at the transition between overlapping and non-overlapping shots.

Referring again to FIG. 2, conventionally all parts of the diagonal pattern 210, including core region 212 and outer region 216 are formed using non-overlapping VSB shots. If using optical lithography, OPC for the outer region 216 may have been carefully designed to include the effects of the waviness from non-overlapping VSB shots of a particular size and spacing. To avoid time-consuming OPC re-design, it may therefore be desirable to avoid fracturing changes in the outer region 216. Use of non-overlapping VSB shots for the constant-width core region 212 of pattern 210, however, can save significant shot count, because core region 212 is typically the largest region. Therefore, use of non-overlapping shots for the outer region 216, and use of overlapping shots for core region 212, presents a potential for shot count reduction while preserving the OPC calculations in the outer region 216. In this scenario, the periods and amplitudes (LER) of the waviness from region 212 overlapping shots will be different than those from non-overlapping shots in outer region 216. At the transition point between non-overlapping and overlapping shots, abrupt changes in the pattern formed on the mask can cause inaccuracies in the pattern transferred to the wafer. FIGS. 8A&B illustrate examples of potential inaccuracies.

Figure 8B:
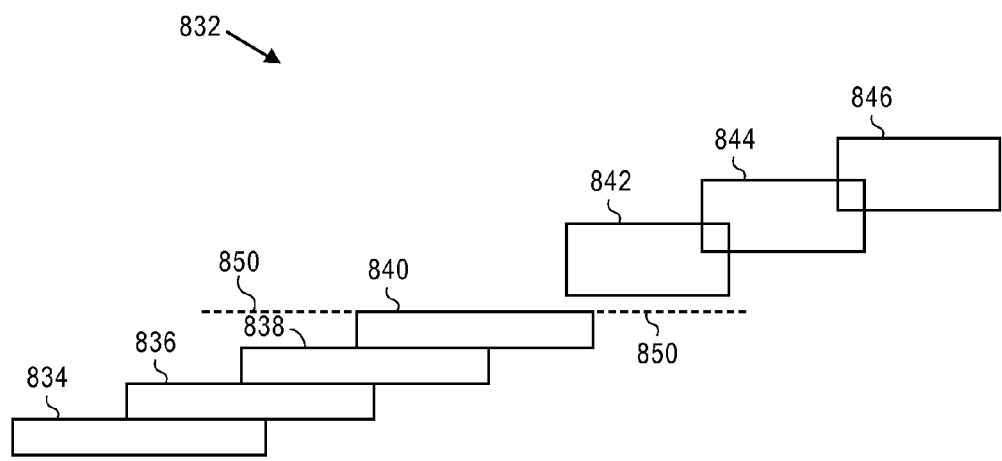
FIG. 8B illustrates an example of a gap created at the transition between overlapping and non-overlapping shots.

FIG. 8A illustrates an example with a set of shots 802 consisting of seven shots, including four non-overlapping shots 804, 806, 808, and 810, and three overlapping shots 812, 814, and 816. The transition line between non-overlapping shots and overlapping shots is illustrated as dashed line 820. As can be seen, the transition causes a narrow area or notch 818, which may cause problems on the mask image and subsequently on the wafer image. FIG. 8B illustrates another example with a set of shots 832 consisting of seven shots, including four non-overlapping shots 834, 836, 838, and 840, and three overlapping shots 842, 844, and 846. The transition line between non-overlapping shots and overlapping shots is illustrated as dashed line 850. As can be seen, a gap exists between shot 840 and shot 842, on the overlapping shot side of transition line 850, where there is insufficient room to place another regularly-spaced overlapping shot. The gap will cause problems on the wafer if it is large enough to appear in the pattern printed on the wafer.

Figure 8C:
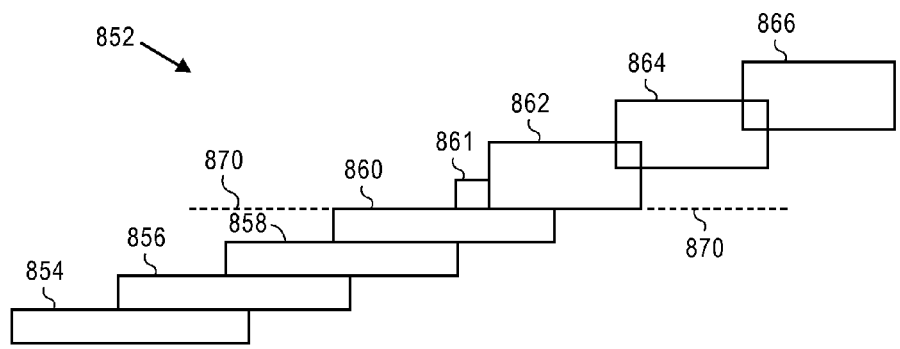
FIG. 8C illustrates another example of transition between overlapping and non-overlapping shots.
Figure 8D:
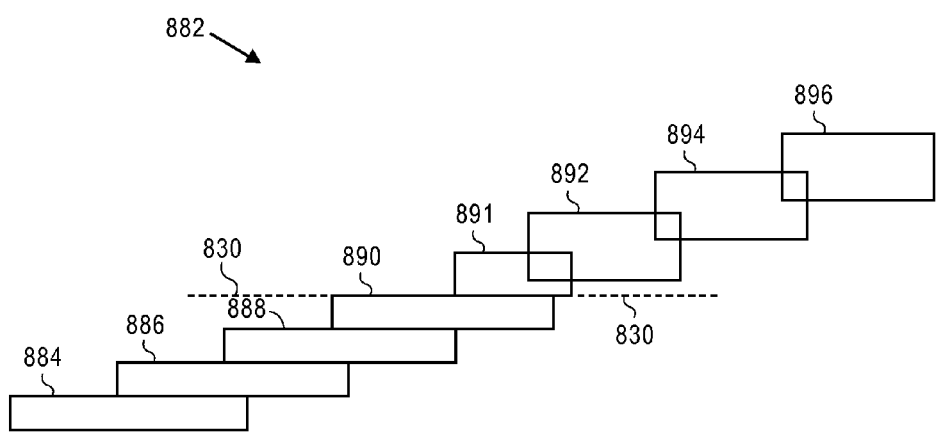
FIG. 8D illustrates another example of transition between overlapping and non-overlapping shots.

FIG. 8C illustrates a set of shots 852, which is similar to set of shots 802. Set of shots 852 consists of eight shots, including four non-overlapping shots 854, 856, 858, 860 and 861, and three overlapping shots 862, 864 and 866. The transition line between non-overlapping shots and overlapping shots is illustrated as dashed line 870. Set of shots 852 provides an improved transition over set of shots 802 because of the additional shot 861 in set of shots 852. It is permitted for shot 861 to not overlap any other shot, although it is in the overlapping shot region above transition line 870. The addition of shot 861 reduces the LER, in particular of the upper edge, of a pattern formed on a surface with set of shots 852, compared to set of shots 802. FIG. 8D illustrates a set of shots 882, which is similar to set of shots 832. Set of shots 882 consists of eight shots, including four non-overlapping shots 884, 886, 888, and 890, and four overlapping shots 891, 892, 894 and 896. The transition line between non-overlapping shots and overlapping shots is illustrated as dashed line 830. Set of shots 882 provides an improved transition over set of shots 852 because of the addition of shot 891 in set of shots 882. Shot 891 eliminates the gap that would otherwise exist between shot 890 and 892. Shot 891 also reduces the LER in the vicinity of the transition line 830 of a pattern formed on a surface with set of shots 882, compared to set of shots 832. However, neither set of shots 852 or set of shots 882 illustrates a sufficiently gradual transition between their respective non-overlapping shot regions and overlapping shot regions. Without the shots below the respective transition lines 870 and 830 having an identical waviness to the shots above the respective transition lines 870 and 830, due to the contributions of neighboring lines and the waviness differences above and below transition lines 870 and 830, the LER of the patterns transferred to a wafer may become unstable in the vicinity of the transition lines 870 and 830. A smoother transition of waviness between the non-overlapping shot regions and overlapping shot regions may be needed.

The problems of abruptly transitioning between overlapping shots and non-overlapping shots can be reduced by an embodiment of the current disclosure, in which one or more transition areas are created between the outer non-overlapping shot region and the core overlapping shot region.

Figure 9A:
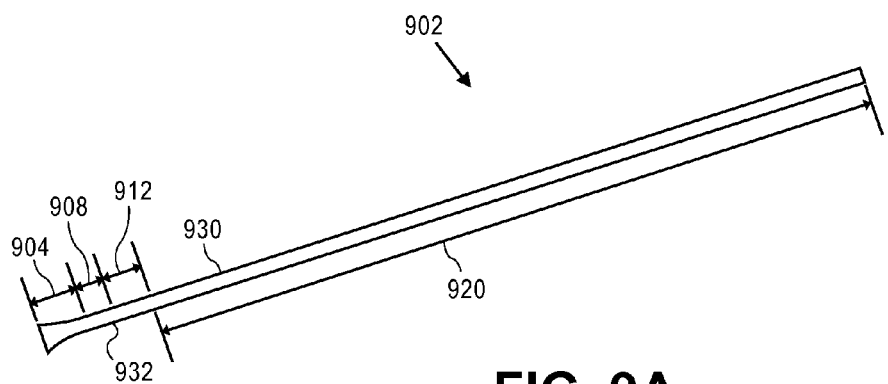
FIG. 9A illustrates an example of a diagonal pattern, divided into regions according to one embodiment.

FIG. 9A illustrates an example of a diagonal pattern 902 in which transition regions are interposed between the core region and the outer region, according to one embodiment. Lengthwise, diagonal pattern 902 comprises a top edge 930 and a bottom edge 932. Diagonal pattern 902 also comprises an outer region 904, in which the pattern width varies, and in which other variations may exist. As set forth above, the outer region 904 is fractured using non-overlapping shots, so that OPC calculations are not invalidated. Adjacent to the outer region 904 is an outer transition region 908, in which the pattern width is constant. Outer transition region 908 is also fractured with non-overlapping shots, so as to not disturb the carefully-calculated OPC calculations for the adjacent outer region 904. The length of the outer transition region 908 is determined so as to provide a "safe" distance between the outer region 904 and adjacent inner transition region 912, so that inner transition region shots, which will have a different LER, LWR, and period from the non-overlapping shots in the outer region 904, will not affect the outer region exposure during lithography. In some embodiments, the determined length of the outer region 904 may be zero. Adjacent to the outer transition region 908, on the opposite side from the outer region 904, is inner transition region 912. Adjacent to the inner transition region 912 is a central core region 920. The central core region 920 is fractured with overlapping shots, as set forth above, for example, in relation to FIGS. 7A-C. In some embodiments, the shots of the central core region 920 will be determined so as to optimize LWR. The shots of the inner transition region 912 are determined so as to smoothly transition from the period and LER of the central core region 920 to the period and LER of the outer transition region 908. In the inner transition region 912, the top edge 930 and the bottom edge 932 must transition differently, but both edges must transition smoothly. The width of the inner transition region 912 may be specified by the designer, or may be chosen automatically so as to minimize the transition width while insuring the smoothness of the transition. Each shot in the inner transition region 912 may be optimized to provide a smooth transition, while maintaining the target width of the pattern across as broad a range of manufacturing process variations as possible. Examples of process variations include variation in resist threshold and variation in particle beam source intensity. The optimization maybe provided through a feedback mechanism using lithography simulation. The simulation may be performed in each optimization iteration, or it may be pre-calculated to determine sensitivity of changes made on the mask to the effected change on the wafer.

Figure 9B:
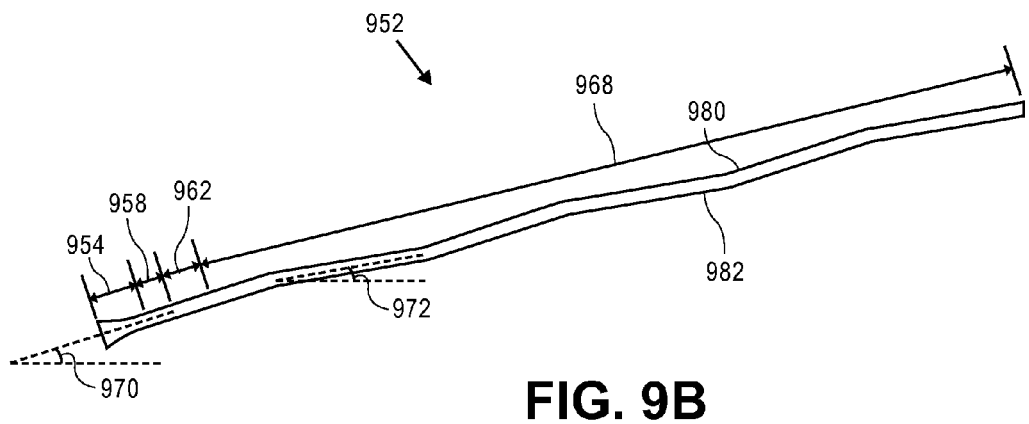
FIG. 9B illustrates another example of a diagonal pattern, divided into regions according to another embodiment.

FIG. 9B illustrates another example of a diagonal pattern 952 in which transition regions are interposed between the core region and the outer region, according to another embodiment. Lengthwise, diagonal pattern 952 comprises a top edge 980 and a bottom edge 982. Diagonal pattern 952 comprises of a series of connected sub-patterns, with each sub-pattern consisting of one sub-pattern portion having in this example a centerline angle 970 with respect to the x-axis, and a second sub-pattern portion having in this example a centerline angle 972 with respect to the x-axis. Diagonal pattern 952 comprises an outer region 954, in which the pattern width varies, and in which other variations may exist. As set forth above, the outer region 954 is fractured using non-overlapping shots, so that OPC calculations are not invalidated. Adjacent to the outer region 954 is an outer transition region 958, in which the pattern width is constant. Outer transition region 958 is also fractured with non-overlapping shots, so as to not disturb the carefully-calculated OPC calculations for the adjacent outer region 954. The length of the outer transition region 958 is determined so as to provide a "safe" distance between the outer region 954 and an adjacent inner transition region 962, so that inner transition region shots, which will have a different LER, LWR, and period from the non-overlapping shots in the outer region 954, will not affect the outer region exposure during lithography. In some embodiments, the determined length of the outer region 954 may be zero. Adjacent to the outer transition region 958, on the opposite side from the outer region 954, is inner transition region 962. Adjacent to the inner transition region 962 is a central core region 968. The central core region 968, including both the sub-pattern portions with centerline angle 970 and the sub-pattern portions with centerline angle 972, is fractured with overlapping shots. Shot spacing and shot overlap may differ in different parts of the central core region 968. In some embodiments, the shots of the central core region 968 will be determined so as to optimize LWR. The shots of the inner transition region 962 are determined so as to smoothly transition from the period and LER of the portion of central core region 968 near inner transition region 962, to the period and LER of the outer transition region 958. In the inner transition region 962, the top edge 980 and the bottom edge 982 must transition differently, but both edges must transition smoothly. The width of the inner transition region 962 may be specified by the designer, or may be chosen automatically so as to minimize the transition width while insuring the smoothness of the transition. Each shot in the inner transition region 962 may be optimized to provide a smooth transition, while maintaining the target width of the pattern across as broad a range of manufacturing process variations as possible.

Figure 11:
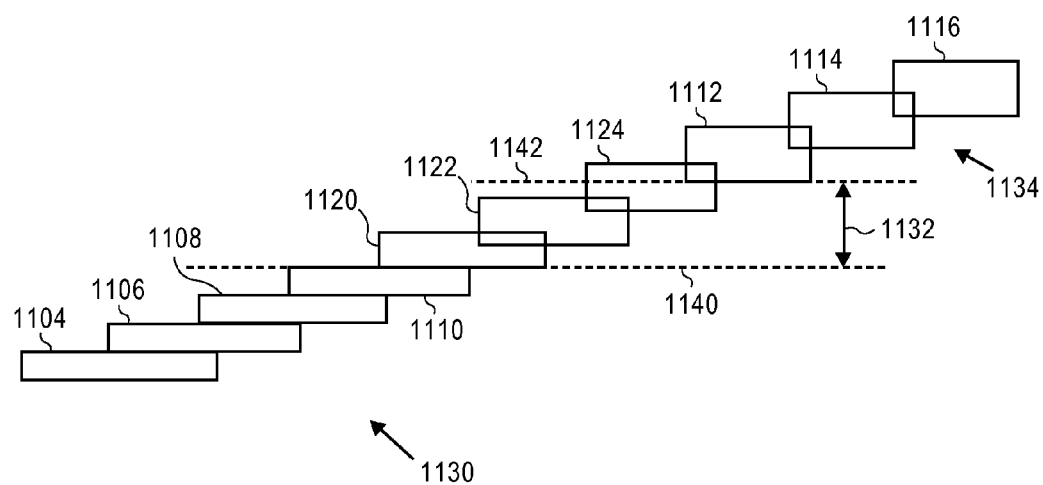
FIG. 11 illustrates an example of a shot generation in a central core region, an outer transition region, and an inner transition region.

FIG. 11 illustrates an example of yet another embodiment. Three regions are illustrated in FIG. 11, including an outer transition region 1130, an inner transition region 1132 and a portion of a central core region 1134. An outer region is not illustrated. Dashed line 1140 denotes the boundary between the outer transition region 1130 and the inner transition region 1132. Dashed line 1142 denotes the boundary between the inner transition region 1132 and the central core region 1134. The outer transition region 1130 comprises four non-overlapping shots, including shot 1104, shot 1106, shot 1108 and shot 1110. The inner transition region 1132 comprises three shots, including shot 1120, shot 1122 and shot 1124. The illustrated portion of central core region 1134 comprises three shots, including shot 1112, shot 1114 and shot 1116. The sizes and overlap of the three shots in transition region 1132 are designed to smoothly transition between the period and LER of the outer transition area shots, and the period and LER of the central core shots. The use of overlapping shots for a portion of the pattern allows overall shot count to be reduced, compared to use of non-overlapping shots. Each of the three inner transition region shots are uniquely sized, and all have unique shot-to-shot spacings.

In other embodiments, a central core region such as central core region 1134 of FIG. 11, may use shot configurations other than VSB shots. In one embodiment, circular character projection (CP) shots are used for the central core region. An outer region and an outer transition region will use conventional VSB shots. The inner transition region may use VSB shots, circular CP shots, or a combination of VSB shots and CP shots to achieve the desired smooth transition between the central core region and the outer transition region.

Referring again to FIG. 9A, as set forth above, overlapping shots are used for the central core region 920 to reduce the shot count, compared to the use of non-overlapping shots for the entire diagonal pattern 902. It is desirable that the use of overlapping shots produce a pattern on the substrate or wafer that is equivalent to a pattern that would be produced by use of non-overlapping shots. Lithography simulation may be used in some embodiments to determine the pattern that will be produced on a wafer from a given reticle or photomask pattern. However, lithography simulation is relatively compute-intensive, and therefore time-consuming. Therefore, various "proxies" for wafer equivalence that do not involve lithography simulation may be used in other embodiments. In one embodiment, equivalence may be determined by segmenting, for example, inner transition region 912 into a plurality of segments, and then for each segment calculating the energy transmitted through the mask during exposure of the substrate using optical lithography. For this technique, equivalence constitutes having the calculated energy for each segment of the inner transition region be within a pre-determined amount or fractional amount of the calculated energy from a mask containing a diagonal pattern 902 formed entirely using conventional non-overlapping VSB shots. Another method of determining equivalence is to measure the LWR in the inner transition region 912. In this case, equivalence constitutes having the LWR of the inner transition region 912 be within a pre-determined amount or fractional amount of the LWR of, for example, the non-overlapping shots in the outer transition region 908. Yet another method of determining equivalence is to take the first derivative or the second derivative of the reticle pattern LER with respect to distance. In this case equivalence may constitute the first or the second derivative of LER not exceeding a pre-determined value. Yet another method of determining equivalence is to measure the maximum value of LER in the inner transition region 912. In this case equivalence may constitute either the LER not exceeding a pre-determined maximum value, or the maximum LER of the inner transition region 912 being within a pre-determined amount or fractional amount of the LER of the same region if fractured with conventional non-overlapping VSB shots. More generally, a reticle pattern defined by a set of shots, some of which overlap and some of which do not, may be compared with a reticle pattern generated completely from conventional non-overlapping VSB shots, to determine if the reticle patterns are equivalent for the purpose of forming patterns on a substrate such as a wafer using optical lithography. Such comparison may include any mathematical tolerance test of any mathematical deterministic or statistical combinations of parameters.

Figure 12:
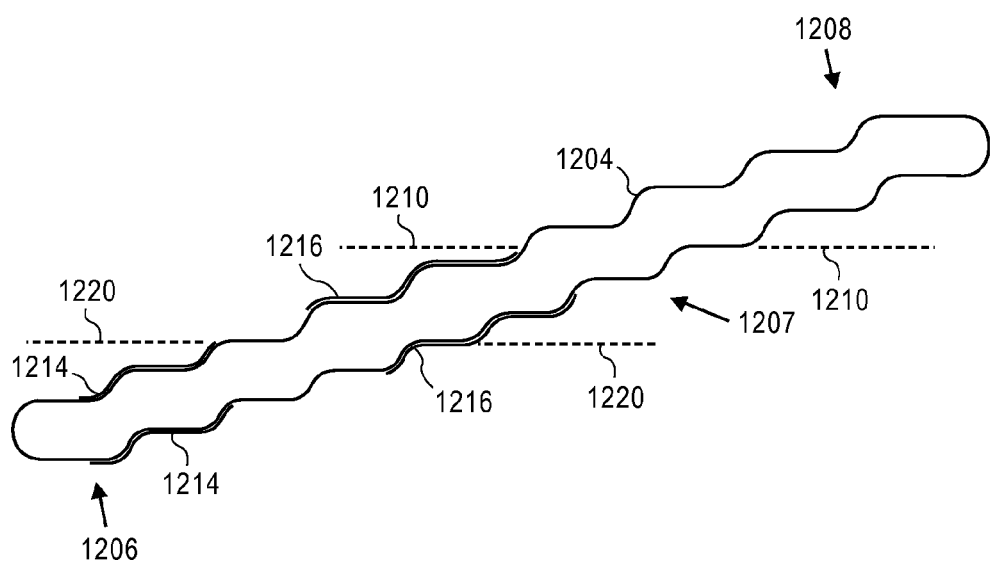
FIG. 12 illustrates an example of a pattern that may be formed on a reticle by the shots of FIG. 11, with CD markers also shown.

Other methods of determining equivalence involve the creation on the simulated reticle pattern of critical dimension (CD) markers, which are designated paired portions of the perimeter of a reticle pattern. FIG. 12 illustrates an example of a pattern 1204 that may be formed on a reticle by the set of shots illustrated in FIG. 11. Pattern 1204 comprises outer transition region 1206, inner transition region 1207, and central core region 1208. Boundary 1220 illustrates the boundary between the outer transition region 1206 and the inner transition region 1207. Boundary 1210 illustrates the boundary between the inner transition region 1207 and the central core region 1208. Two examples of CD markers are illustrated by double perimeter lines. CD marker 1214 is in the outer transition region and CD marker 1216 is in the inner transition region. The length of CD markers can vary, to the extent that a CD marker may be, for example, longer than the perimeter of the inner transition region. CD markers may be used to measure, for example, pattern width, LER, LWR and pattern centerline position.

The calculations described or referred to herein may be accomplished in various ways. Generally, calculations may be accomplished by in-process, pre-process or post-process methods. In-process calculation involves performing a calculation when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 10:
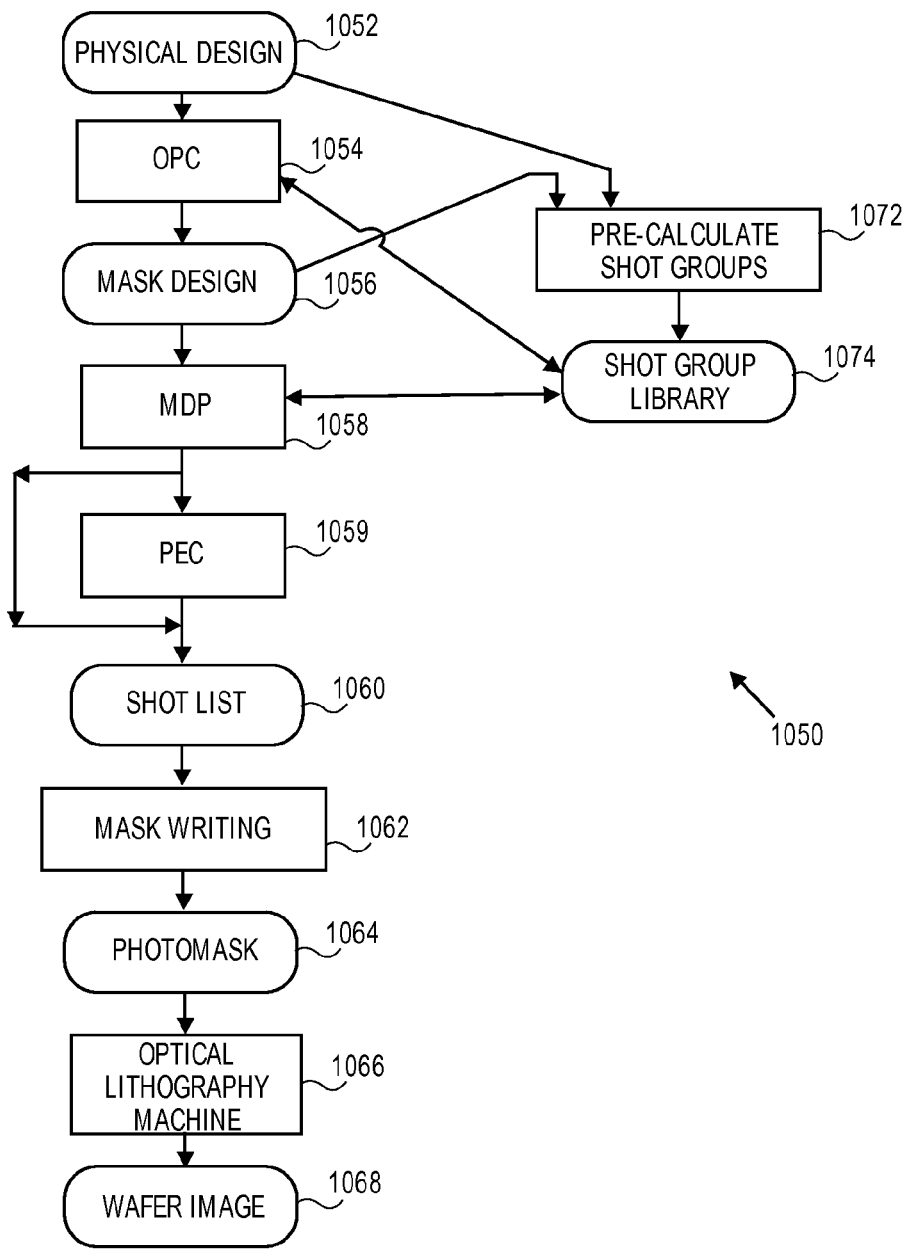
FIG. 10 illustrates an exemplary conceptual flow diagram of preparing a surface, such as a reticle, for use in fabricating a substrate such as an integrated circuit on a silicon wafer using optical lithography.

FIG. 10 is a conceptual flow diagram 1050 of how to prepare a reticle for use in fabricating a surface such as an integrated circuit on a silicon wafer. In a first step 1052, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 1054, optical proximity correction is determined. In an embodiment of this disclosure, this can include taking as input a library of pre-calculated shot groups from a shot group library 1074. In an embodiment of this disclosure, an OPC step 1054 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. The OPC step may create partially curvilinear patterns. The output of the OPC step 1054 is a mask design 1056.

In a step 1058, a mask data preparation operation which may include a fracturing operation, a shot placement operation, a dose assignment operation, or a shot sequence optimization may take place. Determining shots may utilize calculations such as charged particle simulation. Either the OPC step 1054 or the MDP step 1058, or a separate program 1072 can include pre-calculating one or more shot groups that may be used for a given input pattern, and storing this information in a shot group library 1074. Combining OPC and any or all of the various operations of mask data preparation in one step is contemplated in this disclosure. Mask data preparation step 1058 may comprise generating VSB shots for diagonal patterns, including diagonal patterns having constant-width portions and varying-width portions, such diagonal patterns having a central core region, an inner transition region, an optional outer transition region, and an outer region as described above. Mask data preparation step 1058 may also comprise a pattern matching operation to match pre-calculated shot groups to create a mask that matches closely to the mask design. The dosages of the shots determined in step 1058 may be adjusted for long-range effects in a proximity effect correction (PEC) step 1059, to create a final shot list 1060. Alternatively, PEC functionality may be part of MDP step 1058, or PEC functionality may be done as part of mask writing step 1062. Shot list 1060 may therefore be the output of either MDP step 1058 or PEC step 1059.

The shot list 1060 is used to generate a surface in a mask writing step 1062, which uses a charged particle beam writer such as an electron beam writer system. Mask writing step 1062 may use a stencil containing both VSB apertures and a plurality of complex characters, or may use a stencil comprising only VSB apertures. The electron beam writer system projects a beam of electrons through the stencil onto a surface to form patterns in a surface such as a reticle, which is then processed to become a photomask 1064. The completed photomask 1064 may then be used in an optical lithography machine, which is shown in a step 1066. Finally, in a step 1068, a substrate such as a silicon wafer is produced. A shot group pre-calculation step 1072 provides information to the shot group library 1074. Also, the shot group pre-calculation step 1072 may use as input the physical design 1052 or the mask design 1056, and may pre-calculate one or more shot groups, which are stored in a shot group library 1074.

Figure 13:
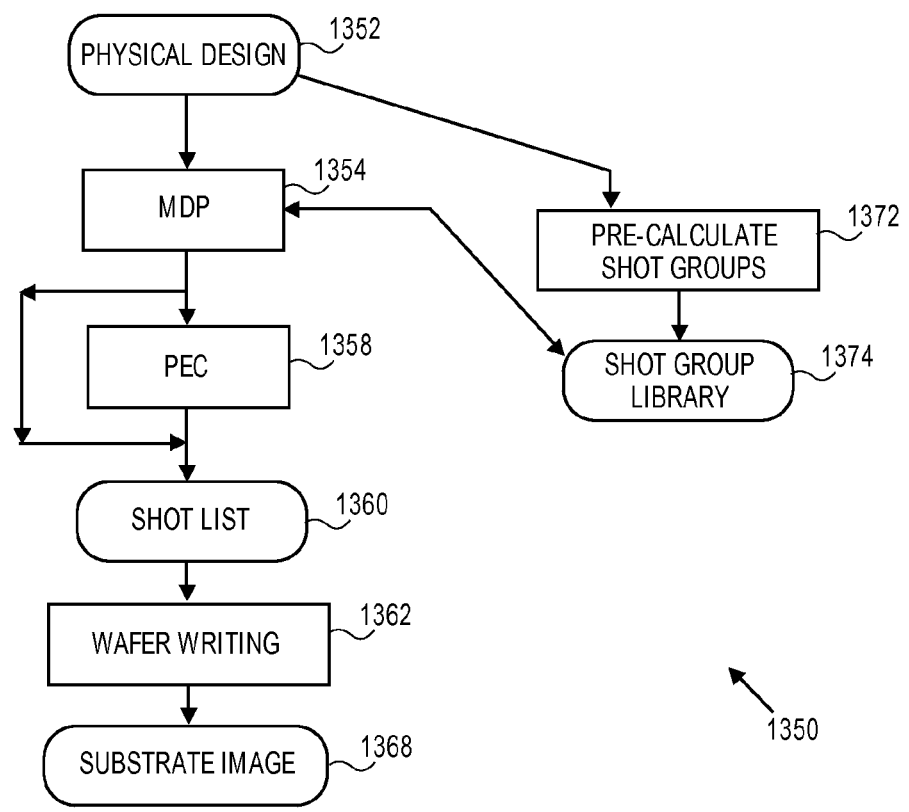
FIG. 13 illustrates an embodiment of a conceptual flow diagram of preparing a surface in fabricating a substrate such as an integrated circuit on a silicon wafer.

Referring now to FIG. 13, another conceptual flow diagram 1350 of how to prepare a surface which is directly written on a substrate such as a silicon wafer is shown. In a first step 1352, a physical design, such as a physical design of an integrated circuit is determined. This may be an ideal pattern that the designer wants transferred onto a substrate. The physical design may be rectilinear, partially curvilinear, or completely curvilinear.

In a step 1354, a mask data preparation (MDP) operation which may include a fracturing operation, a shot placement operation, a dose assignment operation, or a shot sequence optimization may take place. Determining shots may utilize calculations such as charged particle simulation. Either the MDP step 1354, or a separate program 1372 can include pre-calculating one or more shot groups that may be used for a given input pattern, and storing this information in a shot group library 1374. Mask data preparation step 1354 may comprise generating shots for diagonal patterns, including diagonal patterns having constant-width portions and varying-width portions, such diagonal patterns having a central core region, an inner transition region, an optional outer transition region, and an outer region as described above. MDP step 1354 may also comprise a pattern matching operation to match pre-calculated shot groups from shot group library 1374 to create a mask that matches closely to the mask design. The dosages of the shots determined in step 1354 may be adjusted for long-range effects in a proximity effect correction (PEC) step 1358, to create a final shot list 1360. Alternatively, PEC functionality may be part of MDP step 1354, or PEC functionality may be done as part of wafer writing step 1362. Shot list 1360 is therefore the output of either MDP step 1354 or PEC step 1358.

Shot list 1360 is used to prepare a wafer in a wafer writing step 1362. In one embodiment, wafer writing 1362 may be accomplished using an electron beam writer system. The electron beam writer system projects a beam of electrons through an adjustable aperture onto a surface to form patterns on substrate 1368 such as a silicon wafer. A shot group pre-calculation step 1372 provides information to the shot group library 1074. Also, the shot group pre-calculation step 1372 may use as input the physical design 1352, and may pre-calculate one or more shot groups, which are stored in a shot group library 1374. The step 1362 may include repeated application as required for each layer of processing, potentially with some processed using the methods described in association with FIG. 10, and others processed using the methods outlined above with respect to FIG. 13, or others produced using any other wafer writing method to produce integrated circuits on the silicon wafer.

The fracturing, mask data preparation, proximity effect correction and shot group creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation of a semiconductor device layout design to be formed on a wafer, the layout design comprising a diagonal pattern, wherein a portion of the diagonal pattern comprises a constant-width or nearly constant-width track on the wafer, and wherein an inner transition region of the diagonal pattern is adjoined on one side by an outer transition region and on the other side by a central core region, the method comprising the steps of:

determining a set of at least three non-overlapping variable-shaped beam (VSB) outer transition shots which are capable of forming on a surface the portion of the diagonal pattern in the outer transition region;

determining a set of VSB core shots which are capable of forming on the surface the portion of the diagonal pattern in the central core region, wherein each shot in the set of core shots overlaps another shot in the set of core shots;

determining a series of at least three VSB inner transition shots which are capable of forming on the surface the portion of the diagonal pattern in the inner transition region, wherein an inner transition region pattern characteristic smoothly transitions between the pattern defined by the outer transition shots and the pattern being defined by the core shots; and outputting the set of outer transition shots, the set of core shots and the series of inner transition shots.

2. The method of claim 1 wherein the inner transition region pattern characteristic that smoothly transitions comprises line edge roughness (LER).

3. The method of claim 1 wherein the inner pattern region pattern characteristic that smoothly transitions comprises period of waviness.

4. The method of claim 1 wherein the number of core shots is minimized or nearly minimized, while not exceeding a pre-determined central core region line edge roughness (LER).

5. The method of claim 1 wherein the set of core shots will form a pattern on the surface having a pre-determined line width roughness (LWR).

6. The method of claim 1 wherein the surface is a reticle to be used in an optical lithographic process to transfer a pattern to the wafer.

7. The method of claim 1 wherein the step of determining the series of inner transition shots comprises using charged particle beam simulation to calculate the pattern on the surface.

8. The method of claim 7 wherein the charged particle beam simulation includes at least one of a group consisting of forward scattering, backward scattering, resist diffusion, Coulomb effect, etching, fogging, loading and resist charging.

9. The method of claim 7 wherein the surface is a reticle to be used in an optical lithographic process to transfer a pattern to the wafer, and wherein the step of determining the series of inner transition shots comprises using lithography simulation to calculate the pattern on the wafer.

10. The method of claim 9 further comprising the step of optimizing the series of inner transition shots to produce a pattern on the wafer, the pattern having a width substantially equaling the constant-width track, across a range of manufacturing process variations.

11. The method of claim 10 wherein the optimization comprises an iterative procedure, within which lithography simulation is performed.

12. The method of claim 10 wherein the step of optimizing the inner transition shots produces changes in the calculated pattern on the reticle, and wherein the sensitivity of the wafer pattern to changes in the reticle pattern is pre-calculated.

13. A method for forming a semiconductor device layout pattern on a reticle, the layout pattern to be formed on a wafer using a lithographic process with the reticle, the layout pattern comprising a diagonal pattern, wherein a portion of the diagonal pattern comprises a constant-width or nearly constant-width track on the wafer, and wherein an inner transition region of the diagonal pattern is adjoined on one side by an outer transition region and on the other side by a central core region, the method comprising the steps of:

determining a set of at least three non-overlapping variable-shaped beam (VSB) outer transition shots which is capable of forming on the reticle the portion of the diagonal pattern in the outer transition region;

determining a set of VSB core shots which is capable of forming on the reticle the portion of the diagonal pattern in the central core region, wherein each shot in the set of core shots overlaps another shot in the set of core shots;

determining a series of at least three VSB inner transition shots which is capable of forming an inner transition pattern on the reticle, wherein an inner transition pattern characteristic smoothly transitions between the pattern defined by the outer transition shots and the pattern defined by the core shots; and forming the layout pattern on the reticle with the set of outer transition shots, the set of core shots and the series of inner transition shots.

14. The method of claim 13 wherein the number of core shots is minimized or nearly minimized, while not exceeding a predetermined core region line edge roughness (LER).

15. The method of claim 13 wherein the set of core shots is capable of forming a pattern on the reticle having a predetermined line width roughness (LWR).

16. The method of claim 13 wherein the lithographic process comprises an optical lithographic process.

17. The method of claim 13 wherein the step of determining the series of inner transition shots comprises using charged particle beam simulation to calculate the pattern on the reticle.

18. The method of claim 17 wherein the charged particle beam simulation includes at least one of a group consisting of forward scattering, backward scattering, resist diffusion, Coulomb effect, etching, fogging, loading and resist charging.

19. The method of claim 17 wherein the step of determining the series of inner transition shots comprises using lithography simulation to calculate the pattern on the wafer.

20. The method of claim 19 further comprising the step of optimizing the series of inner transition shots to produce a pattern on the wafer of width equaling the constant-width track, across a broad range of manufacturing process variations.

21. A method for forming a semiconductor device layout pattern on a substrate, the layout pattern comprising a diagonal pattern, wherein a portion of the diagonal pattern comprises a constant-width or nearly constant-width track on the wafer, the method comprising the steps of:

using a reticle, where the reticle pattern has been created using a method comprising the steps of:
forming an outer region of the diagonal pattern using a set of non-overlapping variable-shaped beam (VSB) shots;
forming a central core region of the diagonal pattern using a plurality of overlapping VSB shots; and
forming an inner transition region of the diagonal pattern using a plurality of VSB shots, wherein the inner transition region adjoins the central core region on one side and the outer region on the opposite side, and wherein the characteristics of the diagonal pattern transition smoothly from the boundary with the central core region to the boundary with the outer region, wherein the characteristics are selected from the group consisting of line edge roughness (LER) and period of waviness; and forming the layout pattern on the substrate using an optical lithographic process and the reticle.

22. The method of claim 21 wherein the surface comprises the surface of a semiconductor wafer.

23. A method for fracturing or mask data preparation of a semiconductor device layout design comprising a diagonal pattern, the method comprising the steps of:

determining a first set of non-overlapping variable-shaped beam shots that is capable of forming a first pattern portion of the diagonal pattern on a surface, wherein the first pattern portion comprises a first boundary;

determining a second set of charged particle beam shots that is capable of forming a second pattern portion of the diagonal pattern on the surface, wherein the second pattern portion comprises a second boundary; and determining a series of charged particle beam shots which is capable of forming on the surface a third pattern portion of the diagonal pattern which is interposed between the first pattern portion and the second pattern portion and which is adjacent to both the first boundary and the second boundary, wherein the third pattern portion smoothly transitions between the first pattern portion and the second pattern portion.

24. The method of claim 23 wherein the first pattern portion comprises a first line edge roughness (LER) near the first boundary, and wherein the second pattern portion comprises a second LER near the second boundary, and wherein the first LER is different than the second LER, and wherein the smooth transition comprises a smooth transition between the first LER and the second LER.

25. The method of claim 23 wherein the first pattern portion comprises a first period near the first boundary, and wherein the second pattern portion comprises a second period near the second boundary, and wherein the first period is different than the second period, and wherein the smooth transition comprises a smooth transition between the first period and the second period.

26. A system for fracturing or mask data preparation of a semiconductor device layout design to be formed on a wafer using a lithographic process with a reticle, the layout design comprising a diagonal pattern, wherein a portion of the diagonal pattern comprises a constant-width or nearly constant-width track on the wafer, and wherein an inner transition region of the diagonal pattern is adjoined on one side by an outer transition region and on the other side by a central core region, the system comprising:

a device configured to determine a set of at least three non-overlapping variable-shaped beam (VSB) outer transition shots which is capable of forming on the reticle the portion of the diagonal pattern in the outer transition region;

a device configured to determine a set of VSB core shots which is capable of forming on the reticle the portion of the diagonal pattern in the central core region, wherein each shot in the set of core shots overlaps another shot in the set of core shots;

a device configured to determine a series of at least three VSB inner transition shots which is capable of forming an inner transition pattern on the reticle, wherein the inner transition pattern smoothly transitions between the pattern defined by the outer transition shots and the pattern defined by the core shots; and a device configured to output the set of outer transition shots, the set of core shots and the series of inner transition shots.

* * * * *